US007815733B2

(12) United States Patent
Iwai et al.

(10) Patent No.: US 7,815,733 B2
(45) Date of Patent: Oct. 19, 2010

(54) METHOD FOR PRODUCING HEXAGONAL BORON NITRIDE SINGLE CRYSTAL AND HEXAGONAL BORON NITRIDE SINGLE CRYSTAL

(75) Inventors: Makoto Iwai, Kasugai (JP); Katsuhiro Imai, Nagoya (JP); Takatomo Sasaki, Minoh (JP); Fumio Kawamura, Minoh (JP); Minoru Kawahara, Saitama (JP); Hiroaki Isobe, Taki-Gun (JP)

(73) Assignees: NGK Insulators, Ltd., Nagoya (JP); Yusuke Mori, Katano-Shi (JP)

( * ) Notice: Subject to any disclaimer, the term of this patent is extended or adjusted under 35 U.S.C. 154(b) by 358 days.

(21) Appl. No.: 11/837,557

(22) Filed: Aug. 13, 2007

(65) Prior Publication Data

US 2008/0011224 A1 Jan. 17, 2008

Related U.S. Application Data

(63) Continuation of application No. PCT/JP2006/302408, filed on Feb. 7, 2006.

(30) Foreign Application Priority Data

Feb. 16, 2005 (JP) ............................ 2005-039423

(51) Int. Cl.
*C30B 11/00* (2006.01)
*C30B 28/12* (2006.01)

(52) U.S. Cl. .......................... 117/79; 117/952; 117/11; 117/38; 117/31; 117/34

(58) Field of Classification Search .................. 117/88, 117/89, 952, 79, 11, 38, 31, 34; 423/290; 428/336

See application file for complete search history.

(56) References Cited

U.S. PATENT DOCUMENTS 3,141,802 A * 7/1964 Wentorf, Jr. ......... 252/62.3 GA
3,216,942 A * 11/1965 Wentorf, Jr. ......... 252/62.3 GA
3,415,625 A * 12/1968 Babl et al. .................. 423/290
3,469,941 A * 9/1969 Kuhn ......................... 423/290
3,473,894 A * 10/1969 Babl et al. .................. 423/290
4,107,276 A * 8/1978 Schwetz et al. ............. 423/290
4,187,083 A * 2/1980 Wedlake et al. ............... 51/307
4,409,193 A 10/1983 Sato et al.
4,551,316 A * 11/1985 Iizuka ........................ 423/290
4,683,043 A * 7/1987 Melton et al. .......... 204/192.15
4,784,978 A * 11/1988 Ogasawara et al. ........ 501/96.4
4,810,479 A * 3/1989 Biardeau et al. ............ 423/290
5,064,589 A * 11/1991 Ichikawa et al. ............ 264/668
5,236,545 A * 8/1993 Pryor .......................... 117/95
5,296,119 A * 3/1994 Moustakas ............. 204/192.15
5,849,242 A * 12/1998 Rusanova et al. ........... 264/625
6,319,602 B1 * 11/2001 Fauzi et al. ................. 428/366
6,383,465 B1 * 5/2002 Matsumoto et al. ......... 423/290
7,014,826 B2 * 3/2006 Iizuka ........................ 423/290
7,063,741 B2 * 6/2006 D'Evelyn et al. ............. 117/73
7,297,317 B2 * 11/2007 Maniccia et al. ............ 423/290
2003/0140845 A1 * 7/2003 D'Evelyn et al. .............. 117/8
2003/0170161 A1 * 9/2003 Iizuka ........................ 423/290
2003/0183155 A1 * 10/2003 D'Evelyn et al. ............. 117/68
2004/0000266 A1 * 1/2004 D'Evelyn et al. .............. 117/2
2004/0235203 A1 * 11/2004 Gurba et al. ................... 438/8
2005/0081456 A1 * 4/2005 Ihara et al. ..................... 51/307
2006/0051942 A1 3/2006 Sasaki et al.
2006/0140838 A1 * 6/2006 Pultz et al. .................. 423/290
2006/0140839 A1 * 6/2006 Maniccia et al. ............ 423/290
2006/0185577 A1 * 8/2006 Watanabe et al. .............. 117/2
2008/0011224 A1 * 1/2008 Iwai et al. ................... 117/952
2009/0251044 A1 * 10/2009 Shioi .......................... 313/503

FOREIGN PATENT DOCUMENTS

EP 1 548 160 A1 6/2005
JP 57-149899 A1 9/1982
JP 59-073410 A1 4/1984
JP 60-005007 A1 1/1985
JP 2001-072499 A1 3/2001
JP 2001072499 A * 3/2001
JP 2005-145788 A1 6/2005
WO WO 2004/013385 A1 2/2004

OTHER PUBLICATIONS

Hisamitsu Akamaru et al., "*Pressure Dependence of the Optical-Absorption Edge of AlN and Graphite-Type BN*," Journal of Physics and Chemistry of Solids, 2002, vol. 63, pp. 887-894.

M. Yano et al., "*Growth of Nitride Crystals, BN, AlN and GaN by Using a Na Flux*," Diamond and Related Materials, 2000, vol. 9, pp. 512-515.

H. Sachdev et al., "*Investigation of the Chemical Reactivity and Stability of c-BN*," Diamond and Related Materials, 1999, vol. 8, pp. 319-324.

Cortland O. Dugger, "*The Synthesis of Aluminum Nitride Single Crystals*," Material Res. Bulletin, vol, 9, 1974, pp, 331-336.

Kenji Watanabe et al., "*Direct-Bandgap Properties and Evidence for Ultraviolet lasing of Hexagonal Boron Nitride Single Crystal*," Nature Materials, vol. 3, Jun. 2004, pp. 404-409.

* cited by examiner

*Primary Examiner*—G. Nagesh Rao
(74) *Attorney, Agent, or Firm*—Burr & Brown

(57) ABSTRACT

A method of growing hexagonal boron nitride single crystal is provided. Hexagonal boron nitride single crystal is grown in calcium nitride flux by heating, or heating and then slowly cooling, boron nitride and a calcium series material in an atmosphere containing nitrogen. Bulk hexagonal boron nitride single crystal can thereby successfully be grown.

16 Claims, No Drawings

METHOD FOR PRODUCING HEXAGONAL BORON NITRIDE SINGLE CRYSTAL AND HEXAGONAL BORON NITRIDE SINGLE CRYSTAL

CROSS-REFERENCE RELATED APPLICATIONS

Application Ser. No. 11/837,557 is a continuation of PCT/JP2006/302408 filed Feb. 7, 2006.

FIELD OF THE INVENTION

The present invention relates to hexagonal boron nitride single crystals and a method of producing the same.

BACKGROUND ART

Hexagonal boron nitride (h-BN) takes a stable phase having planar graphite structure of SP2 bonds. Hexagonal boron nitride single crystal has superior electrical insulation, a low dielectric constant, heat resistance, chemical stability and lubricating property. It has thus been expected as a material for use in connection with electronics and machinery. In particular, boron nitride has a large band gap of about 6 eV and is thus excellent as a material for a substrate for luminous devices (LED, LD) in the ultraviolet wavelength region. The development of a production technique for a single crystal wafer has been demanded.

It is, however, very difficult to grow bulk single crystal hexagonal boron nitride. This is because hexagonal boron nitride hardly vaporizes until a high temperature and does not easily dissolve, and a flux appropriate for growing hexagonal boron nitride has not been found.

A production technique for growing hexagonal boron nitride single crystal by flux process (solution process) was disclosed in Japanese Patent publication No. 2001-72499A.

It has been further known that aluminum nitride single crystal is obtained by heating aluminum nitride and calcium nitride in sealed state at, for example, 1550° C. or 1610° C. (Mat. Res. Bull. Vol. 9 (1974) pages 331 to 336).

According to Mat. Res. Bull. Vol. 9 (1974) pages 331 to 336, an aluminum nitride material and a calcium nitride material are mixed and then heated to successfully precipitate single crystal aluminum nitride. Such calcium containing flux is, however, extremely high in reactivity, so that it is susceptible to reacting with the crucible material to melt the crucible. It is further described that the sealed crucible may be broken as the inner pressure is increased. Due to these problems, the growth of boron nitride single crystal using a calcium-series flux has not been studied until the present invention was made.

A method of growing hexagonal boron nitride single crystal of a high quality (low defect density) and of a large size has not been known yet. Thus, a novel growing method has been demanded.

SUMMARY OF THE INVENTION

An object of the present invention is to provide a novel method of growing hexagonal boron nitride single crystal.

The present invention provides a method of producing a hexagonal boron nitride single crystal, the method comprising the step of:

heating a material comprising at least calcium atom and boron nitride to grow a hexagonal boron nitride single crystal.

The present inventors have studied a method of possibly growing hexagonal boron nitride single crystal of high quality and a large size. They have thus found that bulk of hexagonal boron nitride single crystal can be precipitated and grown in solution, by heating boron nitride and a material comprising at least calcium atom (calcium series material) in an atmosphere containing at least nitrogen atom. The present invention is thus made.

DETAILED DESCRIPTION OF THE INVENTION

The calcium series material is not limited, as it contains calcium atoms and calcium nitride or calcium metal are most preferred.

The shape of the boron nitride and calcium series materials is not particularly limited, and may be bulk or powder. Further, although the boron nitride and calcium series materials are preferably of a high purity, they may contain a predetermined amount of a dopant depending on the application.

According to the present invention, the boron nitride and calcium series materials are weighed, charged in a crucible and then heated under pressure in a nitrogen-containing atmosphere to grow hexagonal boron nitride single crystal. The material of the crucible is not particularly limited as far as it is not reactive with the calcium containing flux at the growing temperature. For example, it is found that titanium nitride and zirconium nitride can appropriately be used.

Although the partial pressure of nitrogen during the growth is not particularly limited, it is preferably not lower than atmospheric pressure to avoid the evaporation of the materials. Although the upper limit is not particularly limited, it may be 10 atoms or lower from a practical viewpoint.

The atmosphere may be composed of nitrogen only, or may contain a gas other than nitrogen. Such gases other than nitrogen include argon and helium. In the case that the nitrogen-containing atmosphere contains a gas other than nitrogen, the total pressure of the atmosphere is not particularly limited.

Further, although the temperature during the growth is appropriately selected, it is 800 to 1800° C., for example. From the viewpoint of assisting the reaction, the growing temperature is preferably 1200° C. or higher. As the temperature exceeds 1600° C., the vapor pressure of Ca is considerably elevated. Thus, the growing temperature is more preferably 1600° C. or lower.

Further, although the cooling rate after the heating is not limited, slow cooling is preferred from the viewpoint of precipitating a larger crystal. Although the degree of the slow cooling is not particularly limited, fine crystals may become predominant if the cooling rate is large. Thus, the cooling rate is preferably 10° C./hour or smaller, and more preferably 5° C./hour or smaller, from the viewpoint of precipitating the target single crystal. From the viewpoint of improving the crystal quality, the cooling rate is most preferably 1° C./hour or smaller. Further, the cooling rate is preferably 1° C./day or larger from the viewpoint of improving the growth rate.

The ratio of the boron nitride and the calcium series material is preferably BN:Ca=1:3 to 3:1 as a converted molar ratio calculated as boron nitride and calcium, respectively.

Further, in the case that the calcium series material is calcium nitride, the ratio of boron nitride and calcium nitride is preferably $BN:Ca_3N_2$=1:9 to 5:5 as the molar ratio.

Further, an alkali metal such as sodium or lithium or an alkaline earth metal such as barium, strontium or magnesium may be added to the materials. Further, a metal of a low melting point such as tin, indium or zinc may be added. By adding these materials, the solubility of the boron nitride can be improved or the melting point of the materials can be lowered so that the growing temperature can be lowered.

From the viewpoint of improving solubility, an alkali metal or an alkaline earth metal is preferred, and sodium is most preferred. The melting point of the added metal is preferably lower from the viewpoint of the growing temperature.

The term a metal of a low melting point means a metal having a melting point of 500° C. or lower.

In the case that sodium is added, an HIP system is preferably used for preventing the evaporation of the materials.

EXAMPLES

Although preferred examples of the present invention will be described below, the present invention is not to be limited to the following examples and various modifications can be made.

Example 1

Boron nitride powder (purity of 99.99 percent) and calcium nitride powder (purity of 99.99 percent) were weighed in a glove box so that the molar ratio ($BN:Ca_3N_2$) is 10:90. These materials were charged into a crucible of zirconium nitride. The crucible was sealed in a container of stainless steel. Nitrogen gas was filled into the container, and then heated to 1550° C. and pressurized to 10 atms. After it was held at 1550° C. and 10 atms for 1 hour, the temperature was slowly lowered for 50 hours at a rate of 2° C./hour.

As a result, a plate-like transparent crystal having a size of 3 mm and a thickness of about 0.5 mm was successfully obtained. It was confirmed by X-ray diffraction analysis that this crystal was hexagonal boron nitride single crystal.

Example 2

Boron nitride powder (purity of 99.99 percent) and calcium metal powder (purity of 99.99 percent) were weighed in a glove box so that the molar ratio (BN:Ca) is 1:3. These materials were charged into a crucible of titanium nitride. The crucible was sealed in a container of stainless steel. Nitrogen gas was filled into the container, and then heated to 1550° C. and pressurized to 10 atms. After it was held at 1550° C. and 10 atms for 1 hour, the temperature was slowly lowered for 50 hours at a rate of 2° C./hour and then naturally lowered to room temperature.

As a result, a plate-like hexagonal boron nitride single crystal having a size of 2 mm and a thickness of about 0.5 mm was successfully obtained, as confirmed by X-ray diffraction analysis.

Example 3

Boron nitride powder (purity of 99.99 percent), calcium metal (purity of 99.99 percent) and sodium metal were weighed in a glove box so that the molar ratio (BN:Ca:Na) is 6:2:1. These materials were charged into a crucible of titanium nitride. The crucible was sealed in a container of stainless steel. Nitrogen-argon gas mixture was filled in the container using an HIP system, which was then heated to 1400° C. and pressurized to 1000 atms. The partial pressure of nitrogen was made 10 atms. After it was held at 1400° C. for 50 hours, the temperature was naturally lowered to room temperature.

As a result, a plate-like transparent crystal having a size of 3 mm and a thickness of about 0.5 mm was successfully obtained. It was confirmed by X-ray diffraction analysis, that this crystal was hexagonal boron nitride single crystal.

Example 4

Boron nitride powder (purity of 99.99 percent), calcium metal (purity of 99.99 percent) and tin metal were weighed in a glove box so that the molar ratio (BN:Ca:Sn) is 6:2:1. These materials were charged into a crucible of titanium nitride. The crucible was sealed in a container of stainless steel. Nitrogen gas was filled into the container, and then heated to 1400° C. and pressurized to 10 atms. After it was held at 1400° C. for 1 hour, the temperature was lowered for 50 hours at a cooling rate of 2° C./hour and then naturally cooled to room temperature.

As a result, a plate-like transparent crystal having a size of about 2 to 3 mm and a thickness of about 0.5 mm was successfully obtained. It was confirmed by X-ray diffraction analysis that this crystal was hexagonal boron nitride single crystal.

The invention claimed is:

1. A method of producing a hexagonal boron nitride single crystal, the method comprising the steps of:

providing boron nitride and calcium nitride; and heating the boron nitride and the calcium nitride in an atmosphere comprising at least nitrogen and having a nitrogen partial pressure of 10 atm or lower to grow a hexagonal boron nitride single crystal;

wherein said boron nitride single crystal is grown in a crucible comprising zirconium nitride.

2. The method of claim 1, further comprising a step of slow cooling after said heating step.

3. The method of claim 1, wherein at least one metal selected from the group consisting of an alkali metal and an alkaline earth metal is mixed with said calcium nitride and said boron nitride before said heating step.

4. The method of claim 1, wherein at least one metal having a low melting point is mixed with said calcium nitride and said boron nitride before said heating step.

5. A method of producing a hexagonal boron nitride single crystal, the method comprising the steps of:

providing boron nitride and calcium nitride; and heating the boron nitride and the calcium nitride in an atmosphere comprising at least nitrogen and having a nitrogen partial pressure of 10 atm or lower to grow a hexagonal boron nitride single crystal;

wherein said boron nitride single crystal is grown in a crucible comprising titanium nitride.

6. A method of producing a hexagonal boron nitride single crystal, the method comprising the steps of:

providing boron nitride and calcium metal; and heating the boron nitride and the calcium metal in an atmosphere comprising at least nitrogen and having a nitrogen partial pressure of 10 atm or lower to grow a hexagonal boron nitride single crystal;

wherein said boron nitride single crystal is grown in a crucible comprising zirconium nitride.

7. The method of claim 6, further comprising a step of slow cooling after said heating step.

8. The method of claim 6, wherein at least one metal selected from the group consisting of an alkali metal and an alkaline earth metal is mixed with said calcium metal and said boron nitride before said heating step.

9. The method of claim 6, wherein at least one metal having a low melting point is mixed with said calcium metal and said boron nitride before said heating step.

10. A method of producing a hexagonal boron nitride single crystal, the method comprising the steps of:

providing boron nitride and calcium metal; and heating the boron nitride and the calcium metal in an atmosphere comprising at least nitrogen and having a nitrogen partial pressure of 10 atm or lower to grow a hexagonal boron nitride single crystal;

wherein said boron nitride single crystal is grown in a crucible comprising titanium nitride.

11. The method of claim 5, further comprising a step of slow cooling after said heating step.

12. The method of claim 5, wherein at least one metal selected from the group consisting of an alkali metal and an alkaline earth metal is mixed with said calcium nitride and said boron nitride before said heating step.

13. The method of claim 5, wherein at least one metal having a low melting point is mixed with said calcium nitride and said boron nitride before said heating step.

14. The method of claim 10, further comprising a step of slow cooling after said heating step.

15. The method of claim 10, wherein at least one metal selected from the group consisting of an alkali metal and an alkaline earth metal is mixed with said calcium metal and said boron nitride before said heating step.

16. The method of claim 10, wherein at least one metal having a low melting point is mixed with said calcium metal and said boron nitride before said heating step.

* * * * *